United States Patent [19]
Merriman

[11] Patent Number: 5,379,189
[45] Date of Patent: Jan. 3, 1995

[54] ELECTRICAL ASSEMBLIES

[75] Inventor: Terence C. Merriman, Tewresbury, England

[73] Assignee: Smiths Industries Limited Company, London, England

[21] Appl. No.: 143,901

[22] Filed: Nov. 2, 1993

[30] Foreign Application Priority Data

Nov. 3, 1992 [GB] United Kingdom ................ 9223008

[51] Int. Cl.⁶ ............................................. H05K 7/02
[52] U.S. Cl. ...................... 361/760; 361/768; 361/777; 361/821; 257/779; 257/786; 174/261; 174/262; 174/263
[58] Field of Search ........................ 361/513–515, 361/760–761, 763, 766–768, 777–778, 821; 174/260, 261–263; 29/832, 840, 842, 843, 854; 257/779, 786

[56] References Cited

U.S. PATENT DOCUMENTS

| | | | |
|---|---|---|---|
| 5,083,237 | 1/1992 | Tsuji | 361/760 |
| 5,132,864 | 7/1992 | Takemura et al. | 361/760 |

FOREIGN PATENT DOCUMENTS

| | | | |
|---|---|---|---|
| 2410849 | 9/1975 | Germany . | |
| 4192389 | 7/1992 | Japan | 361/777 |

OTHER PUBLICATIONS

Patent Abstracts of Japan, vol. 17, No. 418 (E-1408), Aug. 4, 1993 "Electric Circuit for Leadless Component-Loading Substrate".
Patent Abstracts of Japan, vol. 14, No. 320 (E-0950), Jul. 10, 1990 "Mounting Structure of Chip Component".

Primary Examiner—Bot Ledynh
Attorney, Agent, or Firm—Pollock, Vande Sande and Priddy

[57] ABSTRACT

An electrical circuit has a substrate and a surface mount capacitor having a connector pad at each end. The substrate has two separate contact pads that are both soldered to the same connector pad on the capacitor. Two further contact pads on the substrate are soldered to the other connector pad on the capacitor. The contact pads on the substrate are connected to tracks that extend to plated-through holes and are electrically connected to one another at a point remote from the capacitor.

4 Claims, 2 Drawing Sheets

ELECTRICAL ASSEMBLIES

BACKGROUND OF THE INVENTION

This invention relates to electrical assemblies.

The invention is more particularly concerned with electrical assemblies of the kind including a surface mount capacitor.

Surface mount capacitors are increasingly used in electrical assemblies, such as in those for filtering electromagnetic interference. The most commonly used capacitors are of rectangular shape having a metal pad at each end extending across the width of the capacitor. The pads on the capacitor are aligned with, and soldered to, respective pads on the substrate or circuit board, which in turn are connected to, or formed as a part of, respective tracks on the substrate. This arrangement can perform satisfactorily over a limited range of frequencies but at higher frequencies, typically above about 80 MHz, the performance of the capacitor is degraded as a result of parasitic inductance between the capacitor and the tracks connected to it. The effect of this can be reduced by using special capacitors but these often require more space or are expensive. Where many different lines have to be filtered with their own capacitors, it can add significantly to the cost and volume of the complete assembly and make maintenance more difficult.

BRIEF SUMMARY OF THE INVENTION

It is an object of the present invention to provide an electrical assembly including a conventional capacitor, which can perform satisfactorily at higher frequencies.

According to the present invention there is provided an electrical assembly including a substrate and at least one surface mount capacitor, the capacitor having a single connector pad at each end, the substrate having two separate electrical contact pads both making electrical connection to the same pad on the capacitor but otherwise electrically isolated from one another at the capacitor, the pads on the substrate being electrically connected with respective tracks on the substrate that extend away from the capacitor, and the substrate having at least one other electrical contact pad that makes electrical connection to the other pad on the capacitor.

The tracks on the substrate segregate incoming and outgoing circuitry. The tracks are preferably electrically connected with one another at a point remote from the capacitor. The assembly may include two other electrical contact pads separate from one another that both make electrical connection to the other pad on the capacitor but are otherwise electrically isolated from one another at the capacitor. The tracks may extend to respective plated-through holes extending through the substrate. The pads on the capacitor are preferably connected to the pads on the substrate by soldering.

An electrical assembly according to the present invention, will now be described, by way of example, with reference to the accompanying drawings.

DETAILED DESCRIPTION OF THE PREFERRED EMBODIMENT

Figure 1:
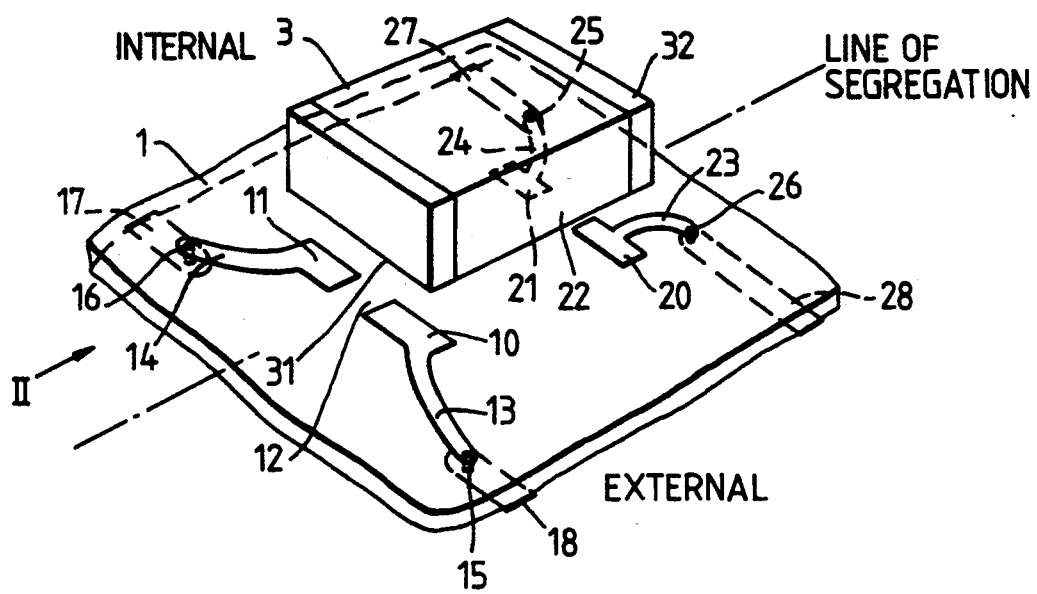
FIG. 1 is a perspective, exploded view of the assembly.
Figure 2:
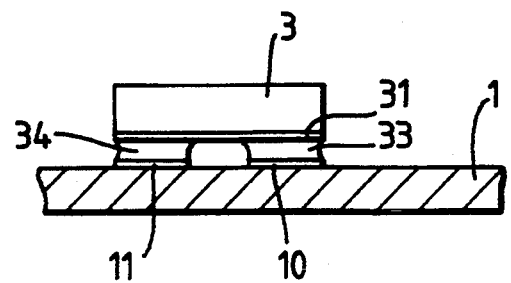
FIG. 2 is a side elevation view along arrow II in FIG. 1.

With reference first to FIGS. 1 and 2, there is shown a circuit assembly including a circuit board or substrate 1 supporting a capacitor 3. The substrate 1 is of an insulative material, such as a resin-bonded glass or a ceramic, and carries electrically-conductive tracks and pads on surfaces of the substrate, only two of which are shown for simplicity. The tracks make connection with various electrical components of which only the capacitor 3 is shown. The upper surface of the substrate has two pads 10 and 11 spaced from one another by a gap 12. The pads 10 and 11 are formed at the ends of respective tracks 13 and 14 extending away from the pads to respective plated-through holes 15 and 16. The tracks 13 and 14 form defined lengths of individual thermal breaks to allow reliable attachment of the capacitor 3. The holes 15 and 16 make electrical connection to various external and internal circuitry, via tracks 17 and 18. The pads 10 and 11 are separated from one another on the substrate itself but are electrically connected with each other via the capacitor. A second pair of pads 20 and 21 is formed opposite the first pair 10 and 11 on the same surface of the substrate 1, the pads being similarly connected with their respective thermal breaks provided by tracks 23 and 24 which extend to plated-through holes 25 and 26 which make electrical connection with similar ingoing and outgoing tracks on the underside of the substrate.

The capacitor 3 is a conventional TDK surface mount capacitor type C2012 of rectangular shape having two contact pads 31 and 32 at opposite ends extending across the entire width of the capacitor. Other surface mount capacitors of a conventional kind having a single pad that extends across the width of the capacitor could be used. The contact pad 31 on one end of the capacitor 3 is connected to both pads 10 and 11 by means of solder layers 33 and 34 respectively. Similarly, the pad 32 at the opposite end of the capacitor 3 is soldered to both pads 20 and 21 on the substrate 1. In this way, the pads 10 and 11 on the substrate 1 are electrically connected with one another via the pad 31 on the capacitor but, without the capacitor, would be locally electrically isolated from one another because of the gap 12. Similarly, the pads 20 and 21 on the substrate are electrically connected with one another via the pad 32 on the capacitor 3 but, without the capacitor 3, would be locally electrically isolated from one another at the gap 22.

The assembly is used with unbalanced lines, to filter out high frequency signals on track 17, the other track 27 being connected to a ground plane 29. Conventional assemblies use a single track and pad on the substrate to make connection with each pad on the capacitor. By contrast, in the assembly described above, the incoming signal from track 17 is supplied to the capacitor via the plated-through hole 15, the track 13 and the pad 10, whereas the outgoing signal takes a separate path to the track 17, via pad 11, track 14 and the plated through hole 16 (or vice versa). By separating the incoming and outgoing tracks, the unwanted effects of parasitic impedance are minimized and the performance of the applied capacitor at high frequencies is considerably improved, as shown below.

Figure 3:
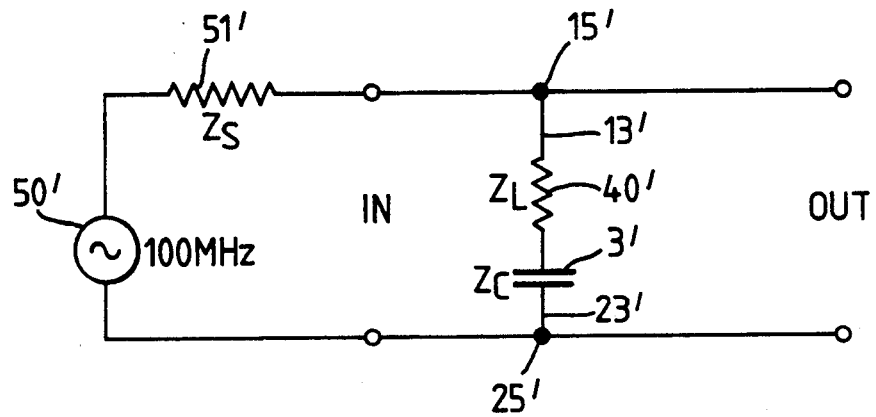
FIG. 3 is a circuit diagram of a prior assembly.

With reference now to FIG. 3 there is shown an equivalent circuit for a conventional assembly in which a capacitor 3' is connected to plated-through holes 15' and 25' via single tracks 13' and 23'. The circuit shows an impedance 40' of value $Z_L$ between the track 13' and the capacitor 3' arising from the connection with the capacitor. The circuit shows the holes 15' and 25' connected across an oscillator 50' and a series resistance 51' of value $Z_S$ of 50Ω. The oscillator 50' represents the source of interference requiring attenuation. The assumed inductance considers one mode of the capacitor only for simplicity.

If the inductance arising from the connection of the capacitor 3' were 14 nH, at 100 MHz this would give:

$$6.28 \times 10^8 \times 14 \times 10^{-9}$$

or $$Z_L = J8.8 \Omega.$$

The self resonance of the capacitor 3 is 500 MHz but will be ignored, for simplicity. The reactance of the capacitor at 100 MHz is $-J1.59$ mΩ. As J8.8 greatly exceeds $-J1.59 \times 10^{-3}$ and it is a ratio, or attenuation, that is sought, it can be assumed that these are measures of impedance $$(Z_L + Z_C)/(Z_S + Z_L + Z_C)$$

or $$(8.8 + 0.00159)/(50 + 8.8 + 0.00159) = 0.1499$$

20 log 0.1499 = −16 dB approximate attenuation.

Figure 4:
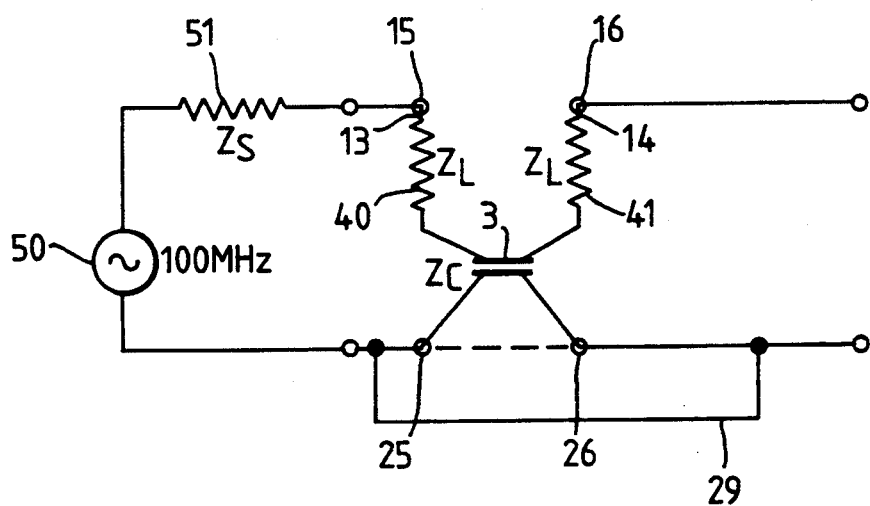
FIG. 4 is a circuit diagram of the assembly of the invention.

Turning now to FIG. 4, which shows the equivalent circuit of the present invention, the components have been given the same reference numerals but unprimed. The circuit differs from that of FIG. 3 in that there is an inductance 40 and 41 between the capacitor 3 and both plated-through holes 15 and 16 arising from connection of the two pads 10 and 11 with the pad 31 on the capacitor; these two inductances have the same value $Z_L$ as the inductance 40' in the circuit of FIG. 3. Because these two inductances feed the capacitor separately, they provide much improved attenuation:

$$Z_C/(Z_S + Z_L + Z_C)$$

or $$1.59 \times 10^{-3}/(50 + 8.8 + 0.0159) = 2.7 \times 10^{-5}$$

20 log $2.7 \times 10^{-5}$ = −91 dB approximate attenuation.

It can be seen, therefore that the capacitor 3 provides a considerably greater attenuation at these higher frequencies when connected in the assembly of the present invention and that it is, therefore, considerably more effective at reducing interference on track 17.

Various modifications are possible to the invention. For example, it is not essential that the other pad 32 on the capacitor is connected to two separate pads on the substrate in the manner described but they could be connected together as shown by the broken line in FIG. 4. The assembly of the present invention could be used in applications other than for interference suppression where optimum performance of the assembly is required.

What I claim is:

1. An electrical assembly comprising a substrate and at least one surface mount capacitor, wherein the capacitor has a single connector pad at each end, wherein the substrate has two separate electrical contact pads and means electrically connecting both contact pads on the substrate to the same connector pad on the capacitor, the contact pads being otherwise electrically isolated from one another at the capacitor, wherein the substrate includes two tracks, wherein the two tracks extend away from the capacitor, the contact pads on the substrate being electrically connected with respective ones of the tracks, and wherein the substrate has two other electrical contact pads separate from one another that both make electrical connection to the other connector pad on the capacitor but are otherwise electrically isolated from one another at the capacitor.

2. An electrical assembly according to claim 1, wherein the tracks are electrically connected with one another at a point remote from the capacitor.

3. An electrical assembly according to claim 1, wherein the tracks extend to respective plated-through holes extending through the substrate.

4. An electrical assembly according to claim 1, wherein the assembly includes a solder connection between the connector pads on the capacitor and the contact pads on the substrate.

* * * * *